United States Patent
Aubry et al.

(10) Patent No.: US 8,878,550 B2
(45) Date of Patent: Nov. 4, 2014

(54) SENSOR DEVICE FOR DETECTING AN OBJECT IN A DETECTION AREA

(75) Inventors: Jean-Marcel Aubry, Bourogne (FR); Thomas W Bach, Brighton (GB)

(73) Assignee: Faurecia Bloc Avant, Nanterre (FR)

( * ) Notice: Subject to any disclaimer, the term of this patent is extended or adjusted under 35 U.S.C. 154(b) by 520 days.

(21) Appl. No.: 13/124,805

(22) PCT Filed: Oct. 17, 2008

(86) PCT No.: PCT/IB2008/055362
§ 371 (c)(1),
(2), (4) Date: Jul. 27, 2011

(87) PCT Pub. No.: WO2010/043936
PCT Pub. Date: Apr. 22, 2010

(65) Prior Publication Data
US 2011/0273188 A1   Nov. 10, 2011

(51) Int. Cl.
*G01B 7/14* (2006.01)
*G01R 27/26* (2006.01)
*G01V 3/08* (2006.01)
*B60R 16/02* (2006.01)
*H03K 17/955* (2006.01)
*E05F 15/20* (2006.01)

(52) U.S. Cl.
CPC .............. *H03K 17/955* (2013.01); *G01V 3/088* (2013.01); *E05F 15/2023* (2013.01); *E05Y 2900/50* (2013.01); *B60R 16/02* (2013.01)
USPC ....................... 324/649; 324/207.26; 324/681

(58) Field of Classification Search
USPC .............................. 324/649, 658–690, 207.26
See application file for complete search history.

(56) References Cited

U.S. PATENT DOCUMENTS

| | | | |
|---|---|---|---|
| 5,658,652 A * | 8/1997 | Sellergren | 428/71 |
| 6,445,294 B1 | 9/2002 | McDonnell | |
| 6,486,681 B1 | 11/2002 | Weber et al. | |
| 2006/0197521 A1 * | 9/2006 | Becker | 324/207.26 |
| 2009/0140728 A1 * | 6/2009 | Rollins et al. | 324/207.16 |
| 2009/0321149 A1 | 12/2009 | Kaltner | |

FOREIGN PATENT DOCUMENTS

| | | | |
|---|---|---|---|
| DE | 19836054 A | | 2/2000 |
| EP | 0723166 A | | 7/1996 |
| GB | WO9014604 | * | 11/1990 |
| GB | 2376075 A | | 11/2009 |
| JP | H09280806 A | | 10/1997 |
| JP | 2000321113 A | | 11/2000 |

(Continued)

*Primary Examiner* — Melissa Koval
*Assistant Examiner* — Farhana Hoque
(74) *Attorney, Agent, or Firm* — Davidson, Davidson & Kappel, LLC

(57) ABSTRACT

A sensor device is provided. The sensor device includes a sensor pad for detecting an object in a detection area by measuring the impedance variation of the sensor pad, the sensor device further including a back focus plate disposed behind the sensor pad relative to the detection area and a first surrounding focus plate arranged around the sensor pad. The sensor device includes a signal generator that drives the sensor pad and the focus plates with a first set of signals having a predetermined constant phase, frequency and voltage amplitude. The sensor device further comprises at least a second surrounding focus plate arranged around the first surrounding focus plate, the second surrounding focus plate being driven with a second set of signals that are different from the first set of signals feeding the sensor pad.

8 Claims, 2 Drawing Sheets

(56) References Cited

FOREIGN PATENT DOCUMENTS

| | | | |
|---|---|---|---|
| JP | 2003505675 A | 2/2003 | |
| JP | 2005240428 A | 9/2005 | |
| JP | 2008008831 A | 1/2008 | |
| WO | 9014604 A | 11/1990 | |
| WO | 9208947 A | 5/1992 | |
| WO | 2007104540 A | 9/2007 | |

* cited by examiner

SENSOR DEVICE FOR DETECTING AN OBJECT IN A DETECTION AREA

The present invention relates to a sensor device of the type comprising a sensor pad for detecting an object in a detection area near an automotive vehicle by measuring the impedance variation of said sensor pad caused by the presence of an object in the detection area, said sensor device further comprising a back focus plate disposed behind the sensor pad relative to the detection area and a first surrounding focus plate arranged around the sensor pad, said sensor device comprising a signal generator driving said sensor pad and said plates with identical signals of predetermined constant phase, frequency and voltage amplitude.

The invention also relates to an exterior trim part comprising such a sensor device and to an automotive vehicle comprising such an exterior trim part.

BACKGROUND

Such devices are known and are for example used to assist a driver to park its car by informing said driver of the vicinity of obstacles surrounding the vehicle. Generally, such a sensor device informs the driver of the presence of obstacles around the vehicle during driving.

A typical single pad capacitive sensor device works by putting charge onto a sensor pad and measuring the change in voltage caused by the presence of an object in the detection area. The presence of an object changes the coupling capacitance of the sensor pad to the environment. Using nearby plates that are driven from amplifiers following the input signal with a gain near one is the well known guard principle for eliminating some parasitic capacitances i.e. straightening the field toward the target. The measured object volume can be effectively moved by using other nearby plates that are driven from amplifiers following the input signal with different gains. However, this is not a practical solution in many cases as driving nearby plates from a guard amplifier following the signal on the sensor pad but with a gain greater than one can easily cause the system to oscillate.

SUMMARY OF THE INVENTION

If a capacitive sensor device is applied to a structure that is around the same size as the sensor pad then the sensor can be used to sense into and through the structure to detect objects deep in the structure and/or on the other side. However, if the structure is larger than the sensor pad then the field lines will also move sideways into the structure to nearby parasitic earths and the sensitivity sensing into and/or through the structure will be reduced. If the structure is of high permittivity or low resistivity or has a conductive layer on either surface, this reduction in sensitivity to targets inside the structure and/or on the other side will be most marked. In particular using a capacitive sensor for an automotive collision sensor is made difficult due to the conductive primer layer left on the surface of the bumper by the electrostatic painting process used.

In an automotive vehicle, the sensor device is generally placed behind or in an exterior trim part of the automotive vehicle and the conductive primer layer is placed on the outer face of the exterior trim part, which reduces the efficiency of the sensor device.

An object of the present invention provides a sensor device which may efficiently sense the presence of an object through a structure of high permittivity or low resistivity or having a conductive layer on either surface of said structure.

To this end, the present invention provides a sensor device comprising a sensor pad for detecting an object in a detection area near an automotive vehicle by measuring the impedance variation of said sensor pad caused by the presence of an object in the detection area, said sensor device further comprising a back focus plate disposed behind the sensor pad relative to the detection area and a first surrounding focus plate arranged around the sensor pad, said sensor device comprising a signal generator driving said sensor pad and said plates with identical signals of predetermined constant phase, frequency and voltage amplitude, and at least a second surrounding focus plate arranged around the first surrounding focus plate, said second surrounding focus plate being driven with signals different from the signals feeding the sensor pad.

The second surrounding focus plate fed with a different signal straightens the field lines emitted by the sensor device. The field lines are made more parallel even if the internal permittivity is large or resistivity is small or if there is a conductive coating on the surface of the structure on which the sensor device is placed. This decreases the internal parasitic capacitances to earth and increases the portion of field lines going approximately perpendicular from the sensor pad to the object in the detection area. The efficiency of the sensor device is thus improved.

The sensor device may include one or more of the following features:
  the signals driving the second surrounding focus plate have a greater voltage amplitude than the signals driving the sensor pad;
  the impedance of the sensor pad is controlled by a driven rail impedance measuring system comprising an inverter, an oscillator, a power supply rail driver with two DC voltage offset follower amplifier outputs for the power supply rails of the inverter and switches that change the pad function from receiver to transmitter/impedance measurer by turning on and off the oscillator drive to the input of the power supply rail driver of the inverter; and
  the sensor device comprises more than two surrounding focus plates, said plates being around each other, each plate being driven with signals of increasing voltage amplitude as said plate is farther from the sensor pad.

The present invention also provides an exterior trim part for an automotive vehicle, comprising a sensor device for detecting an object in a detection area near an automotive vehicle on which said exterior trim part is mounted, wherein the sensor device is as described above.

The exterior trim part may include one or more of the following features:
  the exterior trim part comprises at least two sensor devices, one sensor device acting a voltage or current transmitter and the other device acting as a voltage or current receiver, the coupling capacitance between the sensor devices being measured to determine the presence of an object in the detection area or the impedance of each sensor pad of said sensor devices being measured to determine the presence of an object in the detection area;
  the sensor device is fixed to the inner face of the exterior trim part;
  the sensor device is overmoulded by the material of the exterior trim part; and
  a conductive layer is disposed on the outer face of the exterior trim part.

The present invention also provides an automotive vehicle comprising at least an exterior trim part as described above.

BRIEF DESCRIPTION OF THE DRAWINGS

Other aspects and advantages of the invention will appear by reading the following description, given by way of example and made in reference to the accompanying drawings, wherein.

DETAILED DESCRIPTION

In the description, the terms "inner", "outer", "front", "rear" etc. are defined relative to the usual directions in a mounted automotive vehicle.

Figure 1:
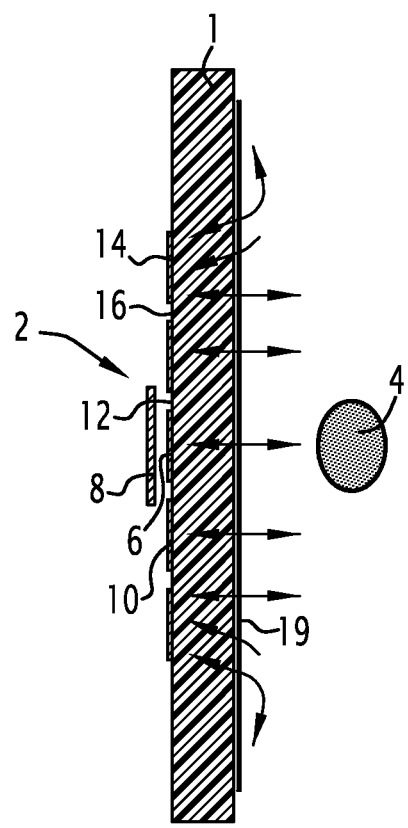
FIG. 1 is a section view of part of an exterior trim part comprising a sensor device according to the present invention.

With reference to FIG. 1, there is described an exterior trim part 1 to be mounted on the front or on the rear of an automotive vehicle. The exterior trim part is for example a bumper. The invention can be applied to the front as well as to the rear of an automotive vehicle. The sensor device being especially advantageous when installed to the front and to the rear of the automotive vehicle in order to provide a larger detection area. The sensor device can also be installed on the sides of the automotive vehicle in order to provide a larger detection area. Generally, the invention can be applied to any exterior trim parts of the automotive vehicle, including fascia. The invention can also be applied to other field than the automotive industry, when the detection of objects or targets through or behind a structure is needed. The invention will now be described for a sensor device for detecting an object in a detection area near an automotive vehicle.

A sensor device 2 is fixed to the exterior trim part 1, on the rear side thereof as shown in FIG. 1. Alternatively, the sensor device 2 can be overmoulded by the exterior trim part 1, i.e. the sensor device 2 is placed in the material forming the exterior trim part.

The sensor device 2 is arranged to detect the presence of an object 4 in a detection area extending in front of the exterior trim part 1, i.e. around the automotive vehicle. Therefore, the sensor device 2 must detect the object "through" the structure formed by the exterior trim part 1.

The sensor device 2 comprises a sensor pad 6 for detecting the object 4 in a detection area by measuring the impedance variation of the sensor pad 6 caused by the presence of the object 4 in the detection area. The sensor device 2 further comprises a back focus plate 8 disposed behind the sensor pad 6 relative to the detection area and a first surrounding focus plate 10 arranged around the sensor pad 6. Both the sensor pad 6 and the first surrounding focus plate 10 are disposed against the rear side of the exterior trim part 1 and extend on the same plane, in the embodiment shown in FIG. 1, while the back focus plate 8 is spaced from the sensor pad 6 and the first surrounding focus plate 10 and extends in a plane parallel to the plane wherein the sensor pad 6 extends. The first surrounding focus plate is also spaced from the sensor pad 6 by an area 12 of the material forming the exterior trim part 1 as shown in FIG. 2.

Figure 2:
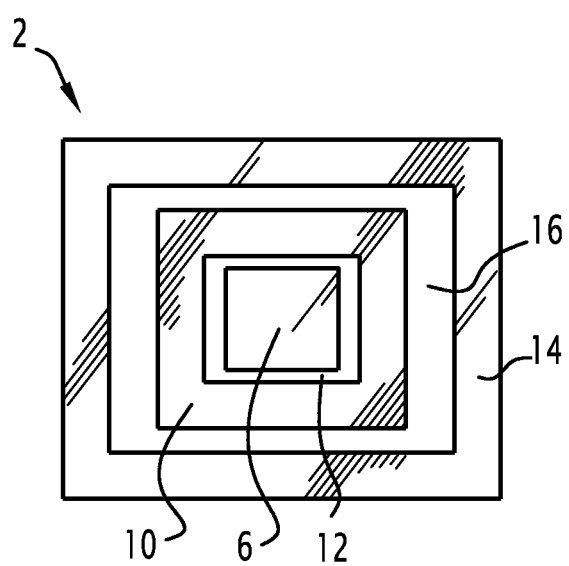
FIG. 2 is a plan view of part of a sensor device according to the present invention.

The sensor device 2 further comprises a second surrounding focus plate 14 arranged around the first surrounding focus plate 10 and spaced from the first focus plate 10 by an area 16 of the material forming the exterior trim part 1 as shown in FIG. 2. The sensor pad 6 and the first and second surrounding focus plates 10 and 14 all extend in the same plane.

A guard plate 16 is disposed behind and/or around the sensor pad 6 to make the sensor pad more sensitive in one direction.

Figure 3:
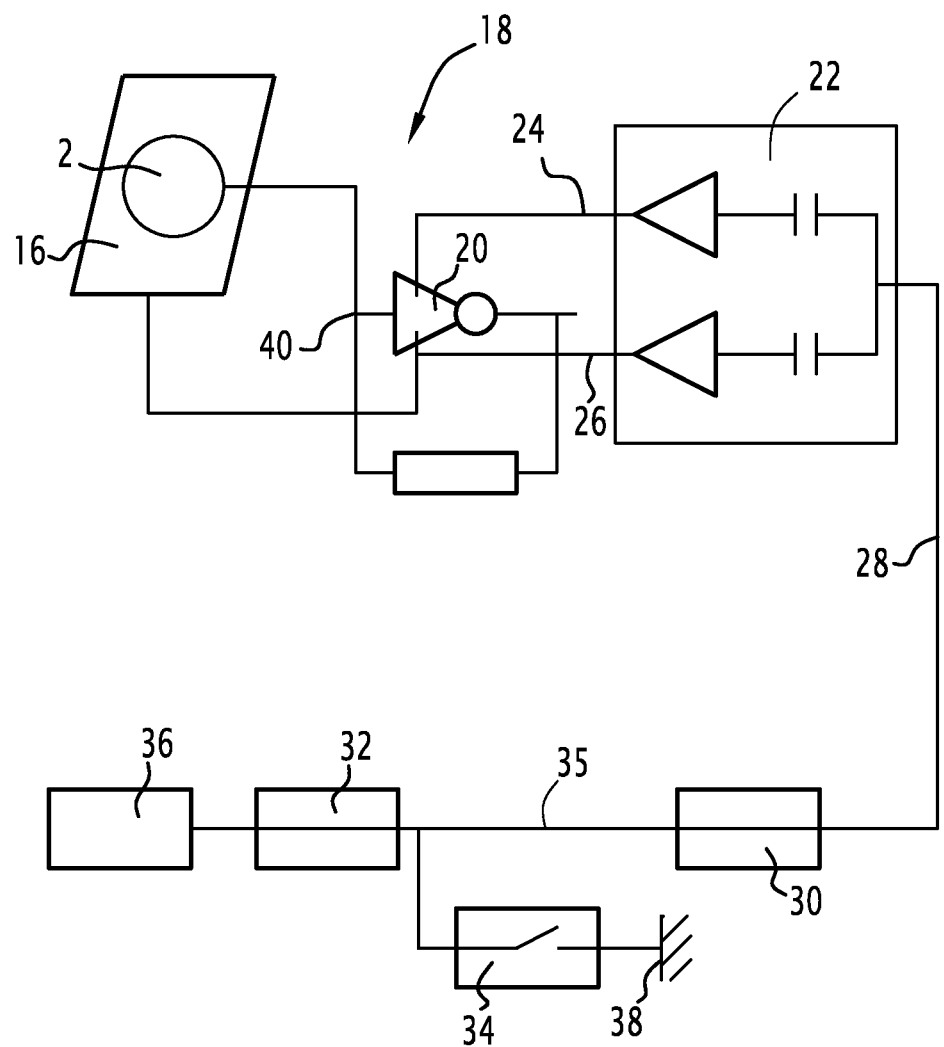
FIG. 3 is a schematic drawing of a driven rail impedance measuring system for controlling the sensor device according to the present invention.

The sensor pad 6, the back focus plate 8 and the first and second surrounding focus plates 10 and 14 are made from a conductive material and are connected to a driven rail impedance measuring system 18, represented in FIG. 3, for controlling the sensor device 2. The driven rail impedance measuring system 18 provides driving signals to the sensor device 2.

The driven rail impedance measuring system 18 is arranged so that the sensor pad 6 is driven with fixed signals of a constant phase and frequency and voltage amplitude. The back focus plate 8 and the first surrounding plate 10 are driven with fixed signals having the same constant phase and frequency and voltage amplitude as the signals driving the sensor pad 6.

The second surrounding plate 14 is driven with signals having the same constant phase and frequency but with a greater voltage amplitude than the signals driving the sensor pad.

Driving the second surrounding focus plate 14 with a different signal straightens the field lines emitted by the sensor device, as shown by the arrows in FIG. 1. The field lines are made more parallel even if the internal permittivity is large or resistivity is small or if there is a conductive coating on the surface of the structure on which the sensor device is placed. This decreases the internal parasitic capacitances to earth and increases the portion of field lines going approximately perpendicular from the sensor pad to the object in the detection area. The efficiency of the sensor device may be thus improved.

In particular, for the exterior trim part 1, a conductive layer 19 is left on the front side of the exterior trim part. This conductive layer 19 is a conductive primer layer left on the surface of the exterior trim part by the electrostatic painting process used. The use of the second surrounding focus plate 14 helps to overcome the effect of the conductive layer 19 which would otherwise reduce the sensitivity of the sensor device 2.

This system of driven focus plates sets up an internal potential in the structure formed by the exterior trim part 1 equal to that on the sensor pad 6 in a 3-D ring around the sensor pad 6. This functions to increase the sensitivity to the target above the sensor pad 6 by straightening the field lines. If it is desired to see through the structure then the focus plates are so driven to make this internal potential equal to that on the sensor pad 6 extend to the other face of the structure. Together this system of driven focus plates makes the parasitic impedance that the sensor pad 6 sees much greater in the direction away from the target so that the impedance change of a target 4 above the sensor inside the structure or outside the structure is larger fractionally. Since the power rails of an inverter with feedback around it are driven with a fixed AC oscillator signal in the above the driven rail impedance measuring system 18 there is no problem of oscillation as there is no feedback path, as will be described later.

The second surrounding focus plate 14 is driven at a higher AC voltage than the sensor pad 6, which straightens the field lines by putting a higher voltage through the structure formed by the exterior trim part in a ring boundary volume to the right of this focus ring plate. This voltage decreases as it reaches the surface due to the proximity of earth. The field lines now can be seen to be made more parallel, as shown by the arrows in FIG. 1, even if the internal permittivity is large or resistivity is small or if there is a conductive coating 19 on the surface.

Either or both effects are counteracted by driving the second surrounding focus plate 14 with this higher voltage. This decreases the internal parasitic capacitances to earth and increases the portion of field lines going approximately perpendicular from the sensor pad 6 to the target 4. The target 4 can be either a conductor or partial conductor or insulator. It is assumed to be either earthed or capacitively earthed.

According to an embodiment, the sensor device 2 comprises more than two surrounding focus plates 10 and 14, the plates being around each other, each plate being driven with signals of increasing voltage amplitude as the plate is farther from the sensor pad 6.

The above described sensor device 2 can be used either as a pad whose impedance is measured or as a voltage or current transmitter or as a voltage or current receiver when several sensor devices 2 are used to detect the presence of an object in the detection area.

The driven rail impedance measuring system 18 uses an inverter 20. The inverter 20 can be constructed from two opposite polarity drain connected enhancement mode MOSFETs or from an operational amplifier with the non-inverting input based at some point between the rails. The guard plate 16 is connected to the VSS rail of the inverter 20. A power supply rail driver 22 has DC voltage offset outputs 24 and 26 to the VDD and VSS rails of the inverter 20.

The input 28 to the power supply rail driver 22 comes from a switch 30 that is a part of a T arrangement of three switches 30, 32, 34 forming a line 35. The switch 32 is connected to an oscillator 36 and the switch 34 is connected to an earth 38. The switch 34 is interposed between the switches 30 and 32. If the switches 30 and 32 are closed and the switch 34 is open then the oscillator 36 is connected to the input 28 of the power supply rail driver 22 so that the DC voltage offset outputs 24 and 26 AC follow the oscillator 36. The switch 34 is used to increase the isolation when the circuit is to be used as a receiver, i.e. when the rails are not to be driven, by connecting line 35 to 0V.

The virtual earth input 40 follows closely in an AC manner the inverter rails. This means the guard plane 16 can be driven by the VSS rail 26, or VDD rail or input 28 to rail driver 22, to reduce the effective capacitance between sensor pad 6 and guard plate 16.

When the switches 30 and 32 are open, the oscillator 36 is no longer connected to the input 28 of the power supply rail driver 22. The switch 34 is closed so that the line 35 connecting the switch 32 to the switch 30 is connected to the earth 38 through the switch 34. This eliminates any feed through of the oscillator signal across the capacitance across the switch 30.

The system described above can measure, using long coaxial cables connected to the sensor pad 6, high frequencies and small capacitances without spurious oscillations than similar functioning accomplished by circuitry with multiplexers in front that have their power supply lines driven to make capacitances to the rails effectively small.

This way of selecting the functionality (impedance measurer, transmitter or receiver), without multiplexers in the input lines, eliminates glitches especially when done at zero crossing points with a fixed number of cycles of the transmitting oscillator. This effect may be achieved because the switching is done at low impedances and thus any glitches, which appear at relatively high impedance, generated by the capacitances of the switches will have a much smaller effect. The non-glitch performance increases the speed in which the different plates can be selected as transmitters or receivers.

The invention claimed is:

1. A sensor device for detecting an object in a detection area near an automotive vehicle comprising:
    a sensor pad, an impedance variation of the sensor pad being used to detect an object in the detection area;
    a back focus plate disposed behind the sensor pad relative to the detection area;
    a first surrounding focus plate arranged around the sensor pad;
    a signal generator driving the sensor pad and the back and first surrounding focus plates with a first set of signals having a predetermined constant phase, frequency and voltage amplitude;
    at least a second surrounding focus plate arranged around the first surrounding focus plate, the second surrounding focus plate being driven with a second set of signals, the second set being different from the first set of signals;
    the impedance of the sensor pad being controlled by a driven rail impedance measuring system which includes an inverter, an oscillator, a power supply rail driver with two DC voltage offset follower amplifier outputs for the power supply rails of the inverter and switches that change the pad function from receiver to transmitter/impedance measurer by turning on and off the oscillator drive to the input of the power supply rail driver of the inverter.

2. An exterior trim part assembly for an automotive vehicle comprising:
    an exterior trim part; and
    a first sensor device for detecting an object in a detection area near an automotive vehicle on which the exterior trim part is mounted; the sensor device comprising:
        a sensor pad, an impedance variation of the sensor pad being used to detect an object in the detection area;
        a back focus plate disposed behind the sensor pad relative to the detection area;
        a first surrounding focus plate arranged around the sensor pad;
        a signal generator driving the sensor pad and the back and first surrounding focus plates with a first set of signals of a predetermined constant phase, frequency and voltage amplitude; and
        at least a second surrounding focus plate arranged around the first surrounding focus plate, the second surrounding focus plate being driven with a second set of signals different from the first set of signals; and
    at least a second sensor device, the first sensor device acting as a voltage or current transmitter and the second sensor device acting as a voltage or current receiver, a coupling capacitance between the first and second sensor devices being measured to determine the presence of the object in the detection area or the impedance of each sensor pad of the first and second sensor devices being measured to determine the presence of the object in the detection area.

3. The exterior trim part according to claim 2, wherein the second set of signals include a greater voltage amplitude than the first set of signals.

4. The exterior trim part according to claim 2, further comprising further surrounding focus plates, the further surrounding plates being around each other, each further plate being driven with signals of increasing voltage amplitude as the further plate is farther from the sensor pad.

5. The exterior trim part according to claim 2, further comprising
    a conductive layer disposed on an outer face of the exterior trim part.

6. The exterior trim part according to claim 2, wherein the first sensor device is fixed to an inner face of the exterior trim part.

7. The exterior trim part according to claim 2, wherein the first sensor device is overmoulded by a material of the exterior trim part.

8. The exterior trim part according to claim 2 wherein the impedance of the sensor pad is controlled by a driven rail impedance measuring system which includes an inverter, an oscillator, a power supply rail driver with two DC voltage offset follower amplifier outputs for the power supply rails of the inverter and switches that change the pad function from receiver to transmitter/impedance measurer by turning on and off the oscillator drive to the input of the power supply rail driver of the inverter.

* * * * *